United States Patent
Kang et al.

(10) Patent No.: US 10,177,166 B2
(45) Date of Patent: Jan. 8, 2019

(54) INTEGRATED CIRCUIT INCLUDING COMPLEX LOGIC CELL

(71) Applicant: SAMSUNG ELECTRONICS CO., LTD., Suwon-si, Gyeonggi-Do (KR)

(72) Inventors: Ju-Hyun Kang, Hwaseong-si (KR); Hyun Lee, Incheon (KR); Min-Su Kim, Hwaseong-si (KR); Ji-Kyum Kim, Seongnam-si (KR); Jong-Woo Kim, Osan-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/409,674

(22) Filed: Jan. 19, 2017

(65) Prior Publication Data

US 2017/0317100 A1 Nov. 2, 2017

(30) Foreign Application Priority Data

Apr. 29, 2016 (KR) .................. 10-2016-0053547

(51) Int. Cl.
*H01L 27/118* (2006.01)
*G06F 17/50* (2006.01)

(52) U.S. Cl.
CPC ...... *H01L 27/11807* (2013.01); *G06F 17/505* (2013.01); *H01L 2027/11875* (2013.01); *H01L 2027/11881* (2013.01)

(58) Field of Classification Search
None
See application file for complete search history.

(56) References Cited

U.S. PATENT DOCUMENTS

| | | | |
|---|---|---|---|
| 6,329,845 B1 * | 12/2001 | Taki | H01L 27/0207 257/E27.062 |
| 7,329,938 B2 | 2/2008 | Kinoshita | |
| 7,919,792 B2 | 4/2011 | Law et al. | |
| 8,357,955 B2 | 1/2013 | Tanaka | |
| 8,928,381 B1 * | 1/2015 | Goh | G01R 31/31854 326/38 |
| 9,165,102 B1 | 10/2015 | MacDonald et al. | |
| 2008/0169487 A1 | 7/2008 | Shimbo et al. | |
| 2008/0283925 A1 * | 11/2008 | Berthold | H01L 21/845 257/368 |
| 2012/0256234 A1 | 10/2012 | Nishimura et al. | |

(Continued)

FOREIGN PATENT DOCUMENTS

| | | |
|---|---|---|
| JP | 1995-249747 | 9/1995 |
| JP | 2012-227395 | 11/2012 |
| JP | 2015-165591 | 9/2015 |

*Primary Examiner* — Benjamin Sandvik
(74) *Attorney, Agent, or Firm* — Volentine, Whitt & Francos, PLLC

(57) ABSTRACT

An integrated circuit includes a complex logic cell. The complex logic cell includes a first logic circuit providing a first output signal from a first input signal group and a common input signal group, and a second logic circuit providing a second output signal from a second input signal group and the common input signal group. The first and second logic circuits respectively include first and second transistors formed from a gate electrode, the gate electrode extending in a first direction and receiving a first common input signal of the common input signal group.

6 Claims, 16 Drawing Sheets

(56) References Cited

U.S. PATENT DOCUMENTS

| | | | |
|---|---|---|---|
| 2013/0002303 A1* | 1/2013 | Viau | H03K 19/0948 |
| | | | 326/121 |
| 2015/0123730 A1 | 5/2015 | Yang | |
| 2015/0263039 A1* | 9/2015 | Singh | H01L 27/11807 |
| | | | 257/206 |
| 2015/0033300 A1 | 11/2015 | Gupta et al. | |
| 2015/0333008 A1 | 11/2015 | Gupta et al. | |
| 2016/0027769 A1 | 1/2016 | Baek et al. | |
| 2016/0086932 A1* | 3/2016 | Chen | H01L 27/0207 |
| | | | 257/369 |

\* cited by examiner

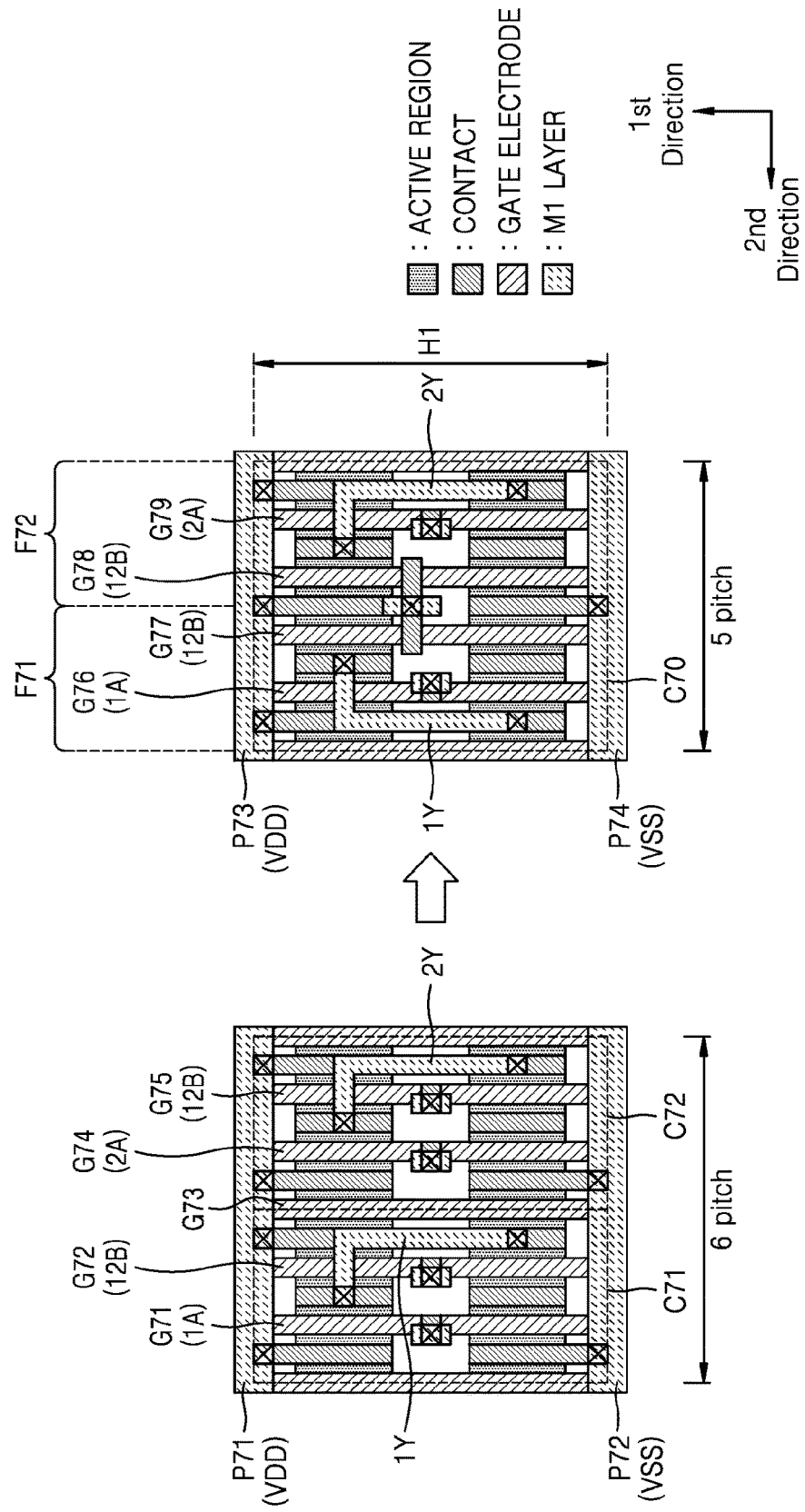

INTEGRATED CIRCUIT INCLUDING COMPLEX LOGIC CELL

CROSS-REFERENCE TO RELATED APPLICATION

This application claims the benefit of Korean Patent Application No. 10-2016-0053547, filed on Apr. 29, 2016, in the Korean Intellectual Property Office, the disclosure of which is incorporated herein in its entirety by reference.

BACKGROUND

The inventive concept relates to integrated circuits, integrated circuits including a complex logic cell, and methods of designing same.

Transistor size has decreased as semiconductor processing techniques have developed. Accordingly, a vast number of transistors may be integrated in a semiconductor device. For example, a system-on-chip (SOC), which indicates an integrated circuit (IC) integrating various components of a computer or other electronic systems on a single chip, has been widely used in various applications, and a semiconductor device including more components is required as performance of an application is higher.

SUMMARY

The inventive concept provides an integrated circuit including a standard cell, and more particularly, provides an integrated circuit including a complex logic cell.

According to an aspect of the inventive concept, there is provided an integrated circuit including; a complex logic cell having a length in a first direction consistent with a multi-height standard cell for the integrated circuit. The complex logic cell includes; a first logic circuit that provides a first output signal from a first input signal group and a common input signal group, and a second logic circuit that provides a second output signal from a second input signal group and the common input signal group, wherein the first and second logic circuits respectively comprise first and second transistors formed from a gate electrode, the gate electrode extending in the first direction and receiving a first common input signal of the common input signal group.

According to an aspect of the inventive concept, there is provided an integrated circuit including a complex logic cell having a length in a first direction consistent with a multi-height standard cell for the integrated circuit. The complex logic cell includes; a first logic circuit that provides a first output signal from a first input signal group and a common input signal group, and a second logic circuit that provides a second output signal from a second input signal group and the common input signal group, wherein the first and second logic circuits respectively comprise first and second transistors formed from first and second gate electrodes, the first and second gate electrodes extending in the first direction and receiving a common input signal of the common input signal group, and the first and second transistors share a source region.

According to an aspect of the inventive concept, there is provided a design method for an integrated circuit including a complex logic cell having a length in a first direction consistent with a multi-height standard cell for the integrated circuit. The method including; arranging the complex logic cell in a layout for the integrated circuit in place of first and second standard cells, wherein the complex logic cell includes; gate electrodes including a first gate electrode extending in the first direction and receiving a first common input signal of a common input signal group, a first logic circuit providing a first output signal from the common input signal group and a first input signal group for the first standard cell, wherein the first logic circuit comprises a first transistor formed from the first gate electrode, and a second logic circuit providing a second output signal from the common input signal group and a second input signal group for the second standard cell, wherein the second logic circuit comprises a second transistor formed from the first gate electrode.

BRIEF DESCRIPTION OF THE DRAWINGS

Embodiments of the inventive concept will be more clearly understood from the following detailed description taken in conjunction with the accompanying drawings in which:

FIGS. 7A and 7B are views of standard cells sharing input signals and a complex logic cell, according to an embodiment of the inventive concept;

DETAILED DESCRIPTION

Figure 1:
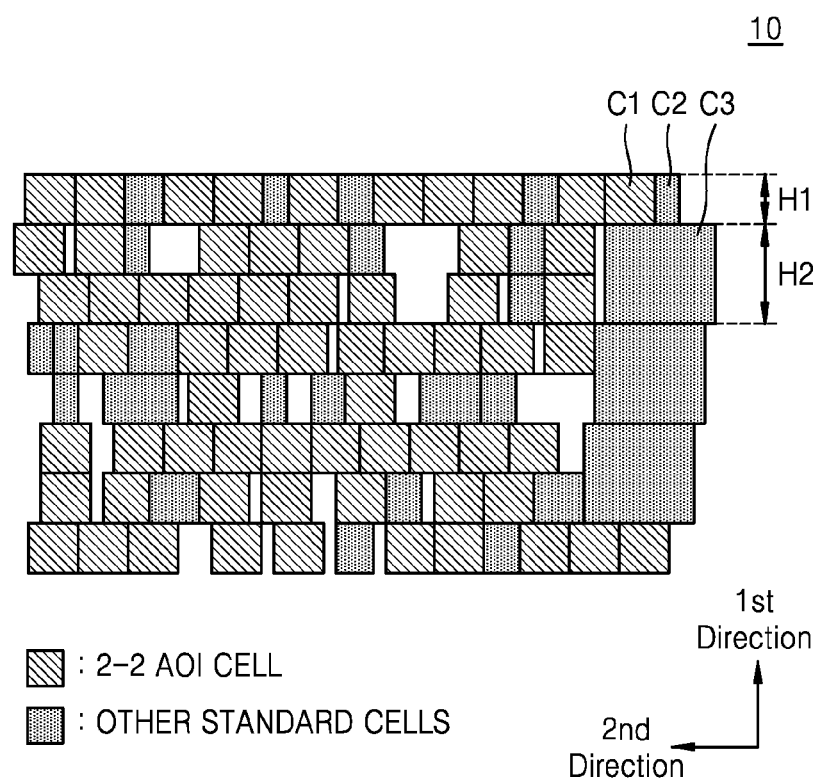
FIG. 1 is a schematic view of a part of a layout of an integrated circuit.

FIG. 1 is a plan view of a portion of a layout for an integrated circuit 10. Referring to FIG. 1, the integrated circuit 10 is assumed to include standard cells C1, C2 and C3.

The standard cell may be understood a constituent (or structural) unit of the integrated circuit 10. Each standard cell may further be understood as performing, selectively providing and/or corresponding to a particular function within the overall operation of the integrated circuit 10. The specific layout for each standard cell may be defined by one or more design constraints (or rules). For example, a standard cell layout may have one or more geometric features (e.g., height, length, width, depth, etc.) that is defined according to one or more arbitrary directions. One geometric feature may be a function of another geometric feature. For example, the height of a standard cell layout may be defined in relation to it length (e.g., the height may be equal to N times the length, where 'N' is a non-zero value). Here, the term length may be understood as extending is a first direction, and the term height may be understood as extending in a different direction or the same direction as the first direction.

A standard cell layout may also define an arrangement of constituent and/or related elements with respect to the standard cell. For example, a standard cell layout may specify that a power source line supplying a voltage to a transistor included in the standard cell must be disposed in a specific position or in relation to an element (e.g., a side surface facing in a particular direction).

A cell library (or a standard cell library) may include information about describing and defining various standard cells. The definition and/or description of each standard cell within the cell library may include; function information, signal (or operation) timing information, geometric information, topological information, etc. The cell library will commonly be referred to by a designer (or automated design tool) during a design process for an integrated circuit.

Referring to FIG. 1, it is assumed that "length" extends in a first direction. Thus each one of first and second standard cells C1 and C2 has a length of H1 measured in the first direction, and a third standard cell C3 has a length of be H2 equal to twice H1. If H1 is assumed to be minimum height for a standard cell included in the integrated circuit 10, then the first and second standard cells C1 and C2 may be said to be "single-height" standard cells. Using this nomenclature, a standard cell (e.g., the third standard cell in the example of FIG. 1) having a height equal to an integer multiple of the single-height may be referred to as a "multi-height" standard cell.

One or more semiconductor design tool(s) may be used during the design process to generate a layout for the integrated circuit 10 (hereafter, "layout"). Such design tools may accept input data from a designer in order to define the layout. For example, a designer may generate data defining a particular behavior (or operation) of integrated circuit 10. Such data may be written in a hardware description language (HDL), such as VHSIC hardware description Language (HDL) and Verilog. Once written the data may be stored in a non-transitory computer-readable storage medium.

Accepting the written data as an input, a semiconductor design tool may generate (e.g.,) a corresponding bitstream or a netlist. This process may reference a cell library during synthesis of the written data. A resulting netlist may include information associated with various standard cells, connection relationships between the standard cells, etc. The semiconductor design tool, including perhaps a so-called place and route (P&R) tool, may "place" standard cells in the layout according to the netlist information, and "route" interconnections between the placed standard cells in order to generate the layout. In this context, the semiconductor design tool may generate the layout using one or many conventionally available formats, such as Graphic Data System II (GDSII). Here, the P&R tool may place and route the standard cells by referring to one or more design constraints controlling the generation of the layout. For example, certain design constraints may include definition of area(s) in the resulting layout, as specified by the designer. Hence, the P&R tool will place and route the standard cells with reference to these area(s) of the layout.

It is common for standard cells to include a circuit (or circuit portion) generating at least one output signal (hereafter, singularly, selectively or collectively "output signal") in response to at least one input signal (hereafter, singularly, selectively or collectively "input signal"). That is, standard cells may include one or more circuits processing an input signal and/or an output signal (hereafter, singularly or collectively "input/output signal"). For example, a standard cell may include (or correspond to) a combination logic circuit including a logic gate generating an output signal by performing a logical operation on an input signal. Alternately or additionally, a standard cell may include a sequential logic circuit (e.g., one or more flip-flops) generating an output signal indicating a "current state" in response to (e.g.,) an internal signal of the standard cell.

A standard cell may include semiconductor devices such as various types of transistor(s) (e.g., a field-effect transistor or FET, a fin-type FET or finFET, etc.), where multiple transistors may be connected according to the operations and/or function(s) provided by the standard cell. Depending on the nature and structure of a transistor included in the standard cell, a channel region (or "channel") may be selectively formed to allow electrical charge to move between a source region and a drain region proximate the channel. For example, where a FET is included in a standard cell, the channel may be formed by an applied gate electrode voltage, and where a finFET is included in the standard cell the channel may be formed by applying a voltage to a gate electrode contacting a pair of opposing side surfaces.

A semiconductor design tool, such as a P&R tool, may be used to variously connect input/output signals of standard cells in the integrated circuit 10 by forming wiring patterns from one or more wiring layers. Many contemporary P&R tools are challenged in their capabilities by certain standard cells (e.g., standard cells corresponding to a combination logic circuit) having a relatively dense constellation of input/output signals. As a result, it is not uncommon for the P&R tool—as it places and routes the standard cells according to a plurality of wiring layers—to generate an empty area in which standard cells are not placed as illustrated in FIG. 1. Such an empty area may be referred to as a "spare region".

P&R tools are also challenged by certain timing requirements (or timing constraints) imposed upon the integrated circuit. That is, in order to satisfy performance requirements established for an integrated circuit, one or more signal speed specifications must usually be met. Accordingly, the P&R tool may place and route interconnections associated with the standard cells in consideration of signal line lengths and corresponding signal delays. The result of such routing congestion that inevitably occurs during the placing and routing processes also effect the space allocation efficiency of the layout for the integrated circuit 10.

Common logic circuits that may be included in a standard cell comprise; AND gates, NAND gates, OR gates, NOR gates, Inverters, etc. These basic logic circuits may be variously combined in many standard cells.

For example FIG. 1 assumes one combination of logic circuits in a standard cell (hereafter, referred to as a "2-2 AOI cell") including a 2-2 AOI, where AOI denotes an AND-OR-Inverter structure, formed by a combination of two, 2-input AND gates (AND2) and one, 2-input NOR gates NOR2. The resulting standard cell has four input signals and one output signal. However, the 2-2 AOI cell is just one convenient example of many logic circuits that include variously configured AND gates, NAND gates, OR gates, NOR gates, Inverters, etc. Hereafter, a circuit including two or more logic gates will be referred to as a "complex logic gate circuit". As further illustrated in FIG. 1, a large, dense arrangement of complex logic gate circuits may be included in a layout for the integrated circuit 10, thereby causing a great deal of routing congestion.

As will be described in some additional detail hereafter, one or more "interconnects" (i.e., conductive elements including (e.g.,) wiring layer pattern(s), contact(s) and/or via(s)) routing common input signal(s) may be removed by replacing two or more standard cells receiving the common input signals in an integrated circuit with a complex logic cell. As a result, routing congestion is alleviated, layout space allocation efficiency, and performance of the integrated circuit may be improved. Hereinafter, a 2-2 AOI cell, a NAND2 cell, and a NOR2 cell will described as a standard cell, but the scope of the inventive concept is not limited thereto. Further, it will be understood that complex logic cells including (or corresponding to) various types of standard cells (e.g., the 2-2 OAI cell) may be incorporated into certain embodiments of the inventive concept.

Figure 2A:
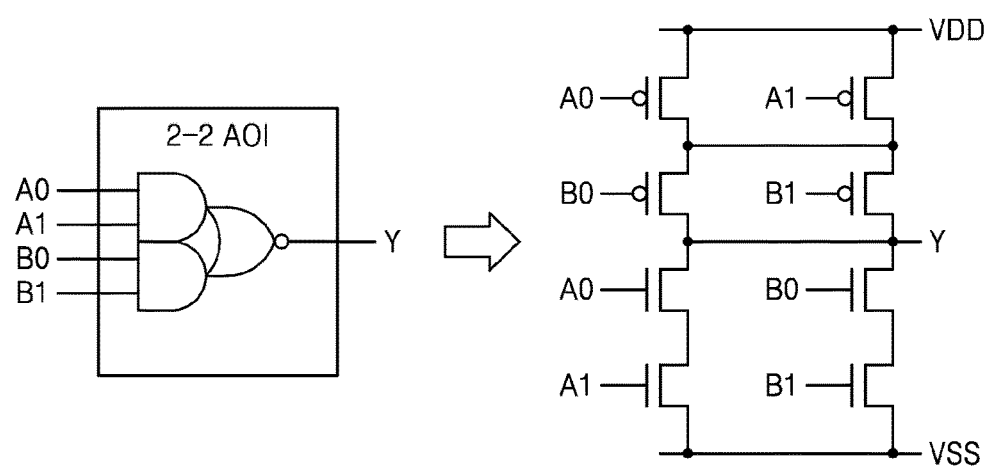
FIGS. 2A and 2B are views of a 2-2 AOI cell.
Figure 2B:
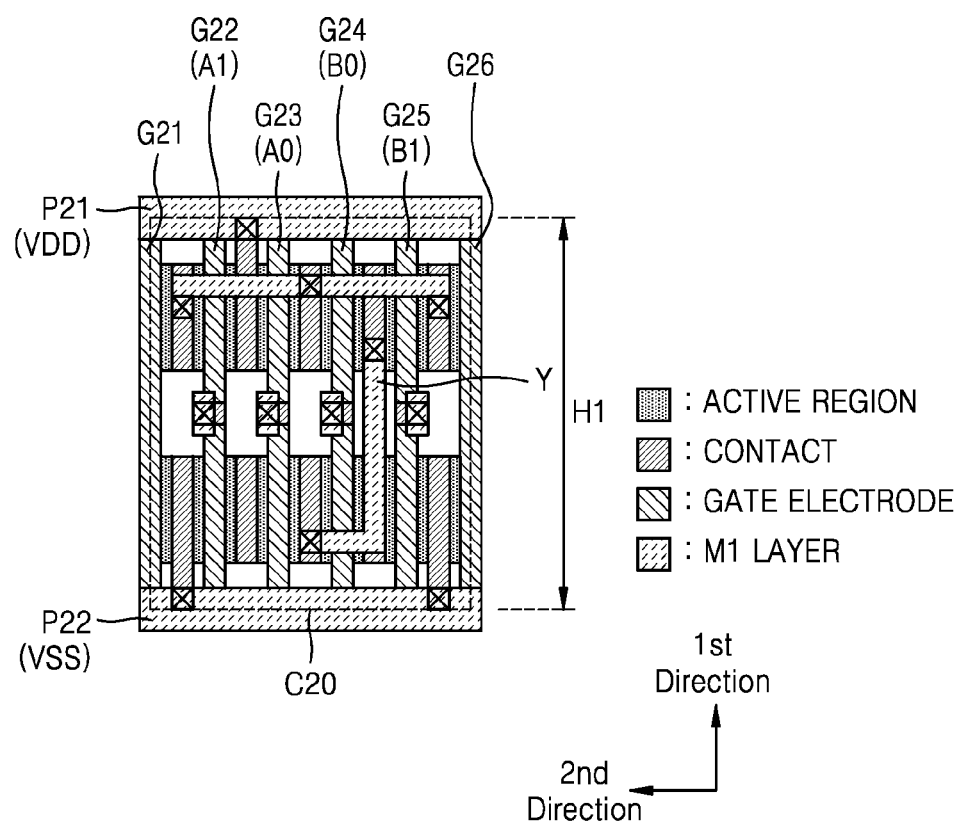

FIG. 2A is a block diagram and an equivalent circuit diagram, and FIG. 2B is a plan (or layout) view of an exemplary 2-2 AOI cell. As described above with reference to FIG. 1, the 2-2 AOI cell receives four input signals A0, A1, B0, and B1, and provides one output signal Y.

Referring to the block diagram of FIG. 2A, the 2-2 AOI cell generates the output signal Y by performing logical operations on the four input signals A0, A1, B0, and B1. Accordingly, the illustrated 2-2 AOI cell may have four input pins respectively receiving input signals A0, A1, B0, and B1, and one output pin providing output signal Y. A semiconductor design tool, for example, a logic synthesis tool may connect the four input pins and one output pin of the 2-2 AOI cell to input pins and/or output pins of other standard cells, and may generate a netlist describing connection information.

Referring to the equivalent circuit diagram of FIG. 2A, the 2-2 AOI cell corresponds to a circuit including four p-channel metal-oxide-semiconductor (PMOS) FETs and four n-channel metal-oxide-semiconductor (NMOS) FETs. The four input signals A0, A1, B0, and B1 may be applied to gates of transistors (or FETs), the transistors may determine an electric potential of the output signal Y by controlling current flowing between a power supply voltage VDD and a ground voltage VSS according to electric potentials of the gates.

Referring to the layout view of FIG. 2B, the height of a 2-2 AOI cell C20 corresponding to the 2-2 AOI cell of FIG. 2A is H1 in a first direction. Here, it is further assumed that the 2-2 AOI cell C20 of FIG. 2B is a single-height standard cell.

As illustrated in layout view of FIG. 2B, the 2-2 AOI cell C20 includes gate electrodes G22 to G25 extending in the first direction, and voltage supply lines P21 and P22 extending in a second direction. Gate electrodes G21 and G26 are arranged at boundaries of the 2-2 AOI cell C20 and may be shared by other standard cells placed adjacent to the 2-2 AOI cell C20 in a second direction. Such adjacent standard cells need not be involved in the control and operation of the 2-2AOI cell C20.

The gate electrodes G22 to G25 may form transistors on an active region, respectively. For example, as illustrated in FIG. 2B, the gate electrode G22 may form a PMOS transistor and an NMOS transistor having gates to which an input signal A1 of the right equivalent circuit of FIG. 2A is applied. The active region of the gate electrodes may be electrically connected to patterns of other layers (e.g.,) power supply lines P21 and P22 or an M1 layer (i.e., a first wiring layer) using a contact.

The input signals A0, A1, B0, and B1 of the 2-2 AOI cell C20 and the output signal Y may be exposed external to the 2-2 AOI cell C20 according (e.g.,) to patterns formed on the M1 layer. For example, the input/output pin illustrated in the block diagram of FIG. 2A may be the patterns formed on the M1 layer. Under this assumption, a P&R tool may connect input/output signals of the M1 layer using an upper wiring layer of the M1 layer (e.g., the M2 layer). As a result, routing congestion, that may occur because of the dense arranging the 2-2 AOI cell C20 is likely to occur in the upper wiring layers of the M1 layer, particularly the M2 layer adjacent to the M1 layer. The 2-2 AOI cell C20 of FIG. 2B is one of many possible layouts for the equivalent circuit of FIG. 2A, and it will be understood that a layout different from the example of FIG. 2B may also be possible.

Figure 3:
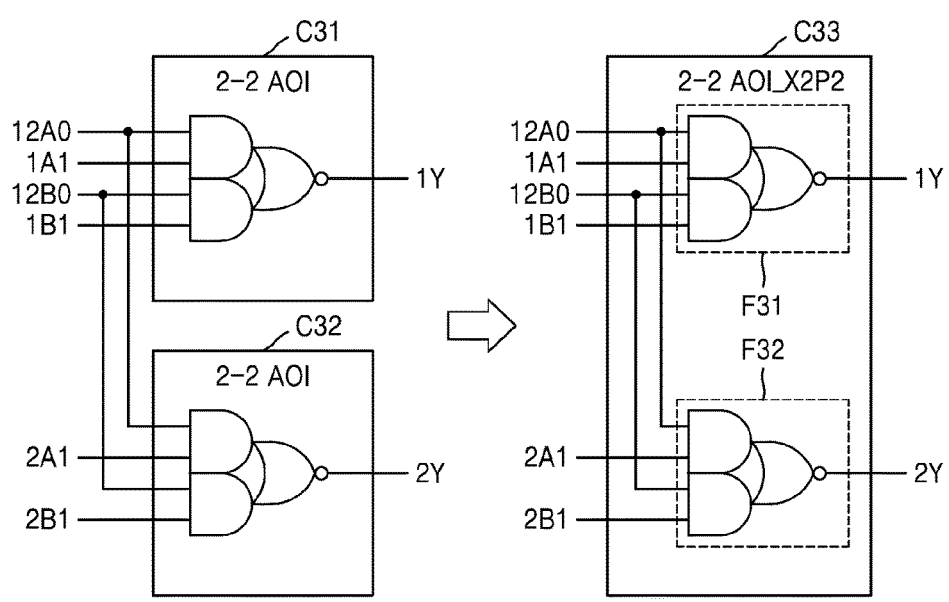
FIG. 3 is a view of standard cells sharing input signals and a complex logic cell, according to an embodiment of the inventive concept.

FIG. 3 is a block diagram, including a left block portion and a right block portion, of standard cells configured to share input signals and a complex logic cell according to an embodiment of the inventive concept. As described above with reference to FIG. 1, standard cells (e.g., multiple one of the same type of standard cell) may be densely placed in an integrated circuit, such that the integrated circuit includes two or more standard cells receiving at least one common input signal.

Referring the left block portion of the diagram of FIG. 3, the integrated circuit may include first and second 2-2 AOI cells C31 and C32 sharing two input signals. For example, the first 2-2 AOI cell C31 may receive a first input signal group including input signals 1A1 and 1B1 and a common input signal group including common input signals 12A0 and 12B0, and may generate a first output signal 1Y. Furthermore, the second 2-2 AOI cell C32 may receive a second input signal group including input signals 2A1 and 2B1 and a common input signal group including the common input signals 12A0 and 12B0, and may generate a second output signal 2Y.

Assuming that each one of the first and second 2-2 AOI cells C31 and C32 is the same as that previously described in relation to FIG. 2, the first and second 2-2 AOI cells C31 and C32 may be, for example, adjacent to each other in the integrated circuit, and two pairs of input pins from among input pins of the first and second 2-2 AOI cells C31 and C32 may be connected to each other external to the first and second 2-2 AOI cells C31 and C32 for the common input signals 12A0 and 12B0. A P&R tool used to connect the two pairs of input pins of the first and second 2-2 AOI cells C31 and C32 may form a pattern in an upper wiring layer of an M1 layer (e.g., the M2 layer). Therefore, patterns formed in the M2 layer for other input signals, that is, the input signals 1A1, 1B1, 2A1, and 2B1 included in the first or second input signal group and the first and second output signals 1Y and 2Y, may be arranged so as to be spaced apart from patterns for common input signals.

Referring to the right block portion of the diagram of FIG. 3, the integrated circuit may include a complex logic cell C33 receiving six of the input signals 12A0, 1A1, 12B0, 1B1, 2A1, and 2B1 and generating the first and second output signals 1Y and 2Y, and the complex logic cell C33 may exhibit the same function as those of the first and second 2-2 AOI cells C31 and C32 having two common input signals illustrated in the left block diagram of FIG. 3. As illustrated in FIG. 3, the complex logic cell C33 may include first and second logic circuits F31 and F32, which exhibits the same function as those of the first and second 2-2 AOI cells C31 and C32, respectively, and two pairs of input pins from among input pins of the first and second logic circuits F31 and F32 may be connected to each other within the complex logic cell C33. For example, the first logic circuit F31, like the first 2-2 AOI cell C31, may receive the first input signal group including the input signals 1A1 and 1B1 and the common input signal group including the common input signals 12A0 and 12B0, and may generate the first output signal 1Y. Furthermore, the second logic circuit F32, like the second 2-2 AOI cell C32, may receive the second input signal group including the input signals 2A1 and 2B1 and the common input signal group including the common input signals 12A0 and 12B0, and may generate the second output signal 2Y.

While the first and second 2-2 AOI cells C31 and C32 in the left block portion of the diagram of FIG. 3 may include eight input pins and two output pins, the complex logic cell C33 in the right block portion of the diagram of FIG. 3 may include six input pins and two output pins. Therefore, routing for the common input signals 12A0 and 12B0 may be omitted, and thus, routing congestion may be reduced. The P&R tool may perform routing for other signals under an increased routing freedom as the result of the complex logic cell C33 in the right block portion of the diagram of FIG. 3, as a result, layout space efficiency and performance of the integrated circuit may be improved.

As such, when a plurality of standard cells, which independently generate output signals in response to input signals, share at least one input signal, space efficiency and performance of the integrated circuit may be improved by replacing a first number of standard cells with a second number of complex logic cells less than the first number. Thus, in the illustrated example of FIG. 3, two standard cells are replaced by one complex logic cell. Logic circuits included in the complex logic cell, that is, circuits respectively corresponding to the standard cells may be insulated from one another, except for the use of (or connection to) common input signal(s) and power node(s). In other words, the circuits respectively corresponding to the standard cells may share a power node and a common input signal group, while the remaining portions of the respective circuit are electrically insulated. In this context, the term "remaining portions" means those portions of the respective circuits sharing a power node and/or a common signal group not involved (or not providing) in the sharing of same. Although FIG. 3 illustrates an example of standard cells sharing two input signals, it will be understood that a complex logic cell corresponding to standard cells sharing one input signal or sharing three or more input signals may designed and implemented according to other embodiments of the inventive concept.

Figure 4A:
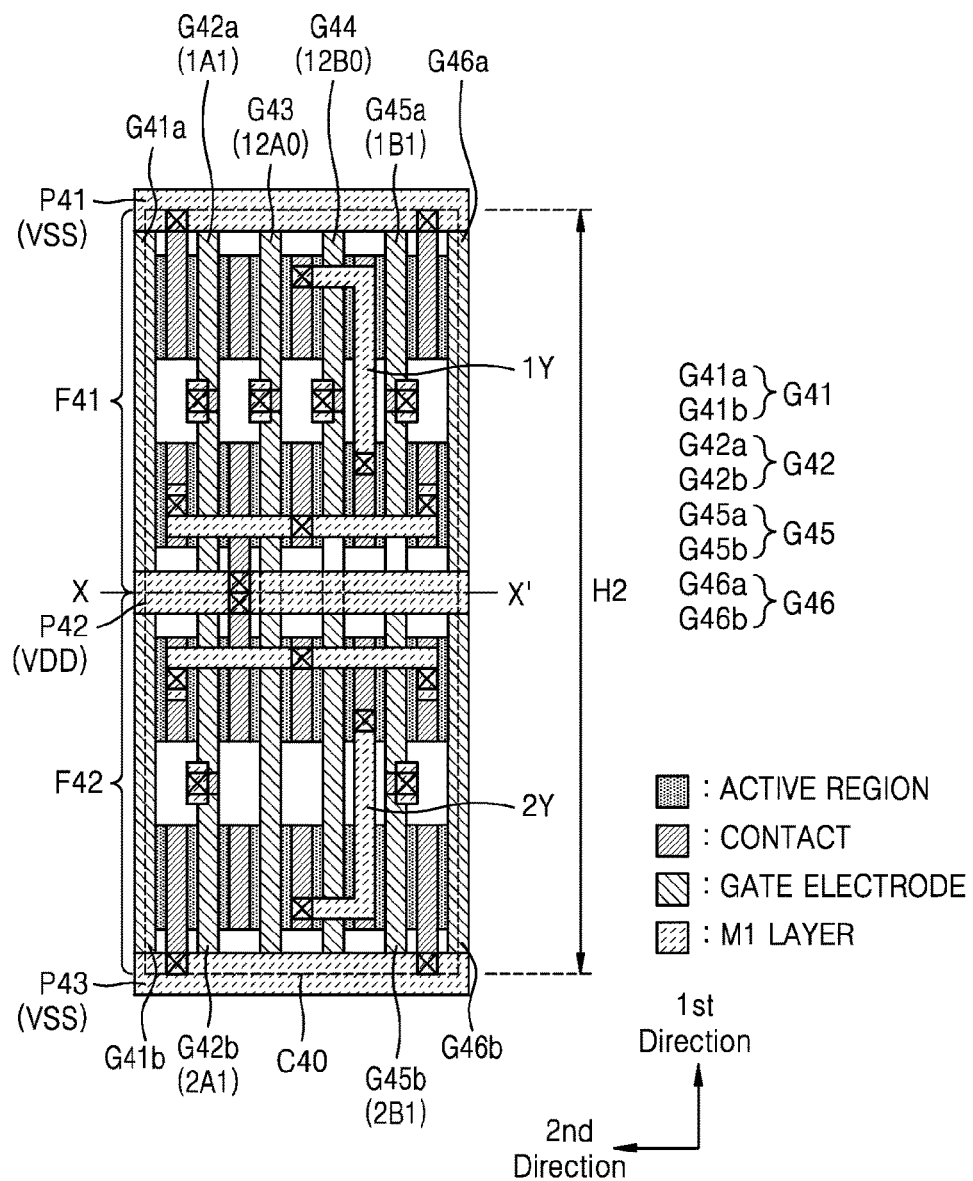
FIGS. 4A and 4B are exemplary views of a layout of the complex logic cell illustrated in FIG. 3.
Figure 4B:
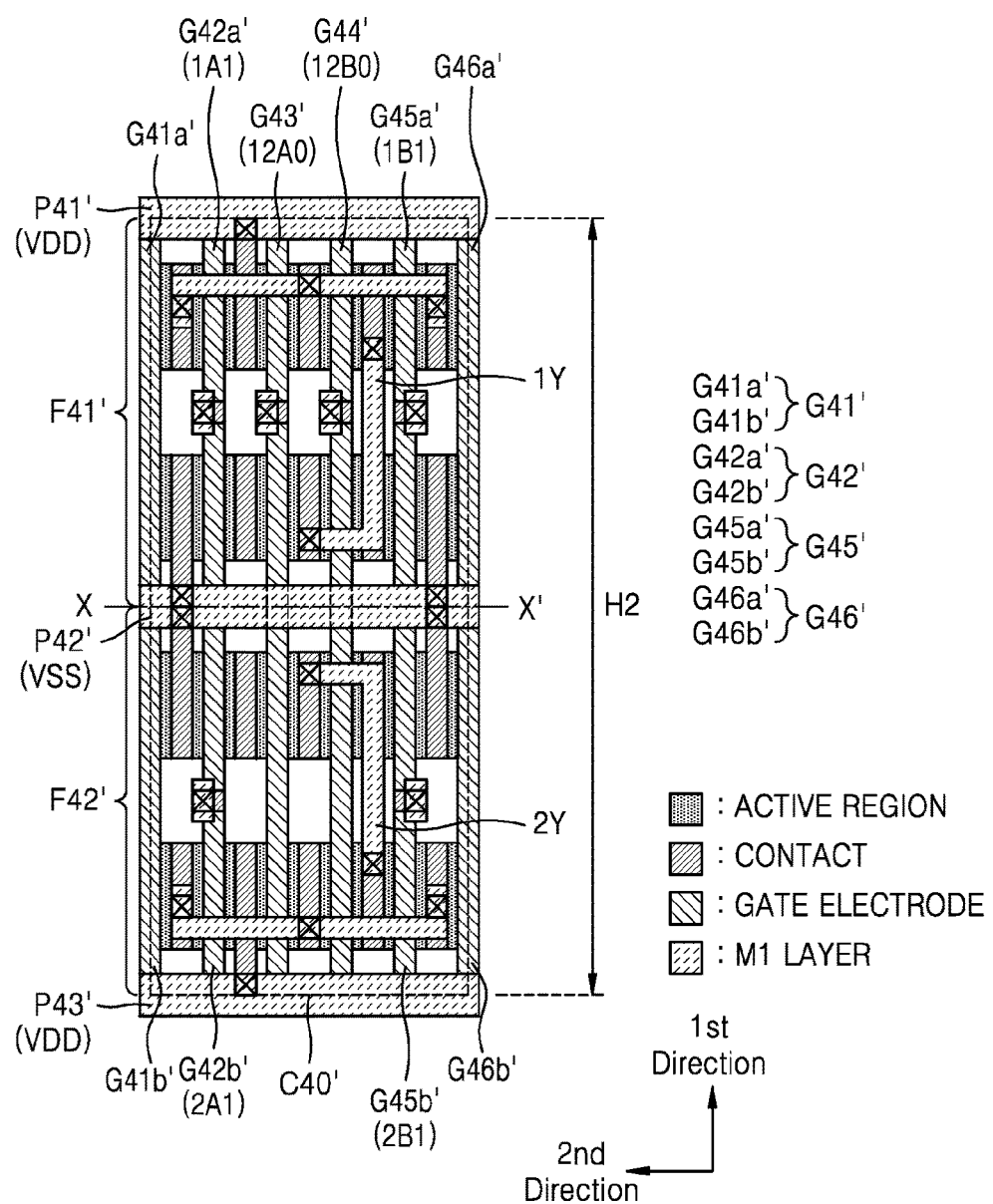

FIGS. 4A and 4B are respective plan views of a layout for the complex logic cell C33 illustrated in FIG. 3. In more detail, FIGS. 4A and 4B respectively illustrate complex logic cells C40 and C40' having a length H2 in a first direction consistent with a multi-height standard cell, and further illustrating voltages applied to power supply lines extending in a second direction. Like reference numbers and labels denote like or similar elements in FIGS. 4A and 4B. It is understood that the illustrated examples of FIGS. 4A and 4B are selected possible layouts for the complex logic cell C33 of FIG. 3. Other layouts are possible according to other embodiments of the inventive concept.

In FIGS. 4A and 4B, two pairs of input pins for first and second logic circuits F31 and F32 in the complex logic cell C33 of FIG. 3 may be connected to each other by gate electrodes. That is, first and second logic circuits F31 and F32 in the complex logic cell C33 of FIG. 3 may share two gate electrodes G43 and G44, and the common input signals 12A0 and 12B0 may be applied to the shared gate electrodes G43 and G44, respectively. According to an embodiment of the inventive concept, the shared gate electrodes G43 and G44 may contact a pair of side surfaces facing each other and an upper surface of a channel region, and the shared gate electrodes G43 and G44 may form an FinFET in the first and second logic circuits F31 and F32.

Referring to FIG. 4A, the complex logic cell C40 may include gate electrodes G42 to G45 extending in the first direction, and may further include voltage supply lines P41 to P43 extending in the second direction. Similar to that described above with reference to FIG. 2B, gate electrodes G41 and G46 arranged in boundaries of the complex logic cell C40 may be shared by other standard cells placed adjacent to the complex logic cell C40 in the second direction, and may not be involved in an operation of the complex logic cell C40.

Referring to FIG. 4A, a first logic circuit F41 corresponding to the first logic circuit F31 of FIG. 3 may be arranged between first and second voltage supply lines P41 and P42. A second logic circuit F42 corresponding to the second logic circuit F32 of FIG. 3 may be arranged between the second voltage supply line P42 and a third voltage supply line P43. The first and second logic circuits F41 and F42 may share the gate electrode G43 to which the common input signal 12A0 is applied and the gate electrode G44 to which the common input signal 12B0 is applied. For example, the first and second logic circuits F41 and F42 may include transistors formed from the gate electrode G43, and may further include transistors formed from the gate electrode G44, respectively.

For convenience of description, FIG. 4A shows the gate electrodes G43 and G44 continuously extending in the first direction, despite the second voltage supply line P42 disposed over the gate electrodes G42 and G44. The unshared gate electrodes G42 and G45 may be cut or separated at a boundary of the first and second logic circuits F41 and F42. That is, near the second voltage supply line P42, and different input signals 1A1, 2A1, 1B1, and 2B1 may be applied to separated portions G42a, G42b, G45a, and G45b of the unshared gate electrodes G42 and G45, respectively.

As illustrated in FIG. 4A, the complex logic cell C40 has six input pins and two output pins. For example, the input signals of the complex logic cell C40 may include two M1 layer patterns respectively connected to the gate electrodes G43 and G44, and four M1 layer patterns respectively connected to the separated gate electrodes G42a, G42b, G45a, and G45b. Furthermore, the output signals for the complex logic cell C40 may include two M1 layer patterns respectively outputting the first and second output signals 1Y and 2Y. As a result, compared to the left block portion of the diagram of FIG. 3, two pins to be connected to M2 layer patterns may be omitted from the complex logic cell C40 of FIG. 4A.

According to an embodiment of the inventive concept, the position of a gate electrode shared by the first and second logic circuits F41 and F42 may be determined upon consideration of a design rule related to a semiconductor manufacturing process for the integrated circuit. For example, based on the design rule, the two gate electrodes G42 and G45 arranged outside from among the gate electrodes G42 to G45 may not be shared by the first and second logic circuits F41 and F42, and instead may be cut near the boundary of the first and second logic circuits F41 and F42. In another example, based on the design rule, gate electrodes shared by the first and second logic circuits F41 and F42 may be neighboring electrodes like the gate electrodes G43 and G44 of FIG. 4A.

According to an embodiment of the inventive concept, the first and second logic circuits F41 and F42 included in the complex logic cell C40 may be symmetrically arranged based on a line crossing the complex logic cell C40. For example, as illustrated in FIG. 4A, the first and second logic circuits F41 and F42 may be symmetrically arranged based on a line X-X' extending in the second direction.

Referring to FIG. 4B, unlike the complex logic cell C40 of FIG. 4A, the complex logic cell C40' may apply a power supply voltage VDD to first and third voltage supply lines P41' and P43', and may apply a ground voltage VSS to a second voltage supply line P42'. Similar to the example of FIG. 4A, in the complex logic cell C40' of FIG. 4B, the first and second logic circuits F41' and F42' may share two gate electrodes G43' and G44', and may have a reduced number of input pins, accordingly.

Figure 5A:
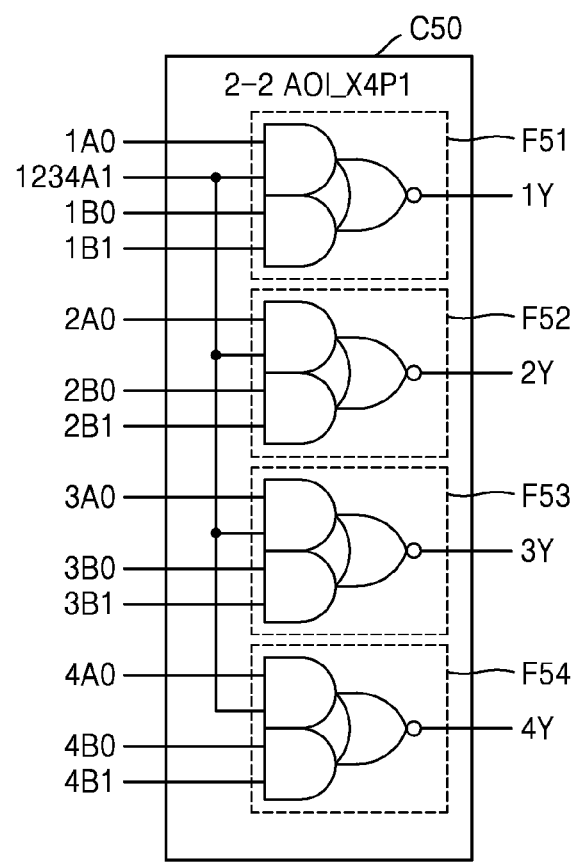
FIGS. 5A and 5B are a block diagram and a view of a layout of a complex logic cell, respectively, according to an embodiment of the inventive concept.
Figure 5B:
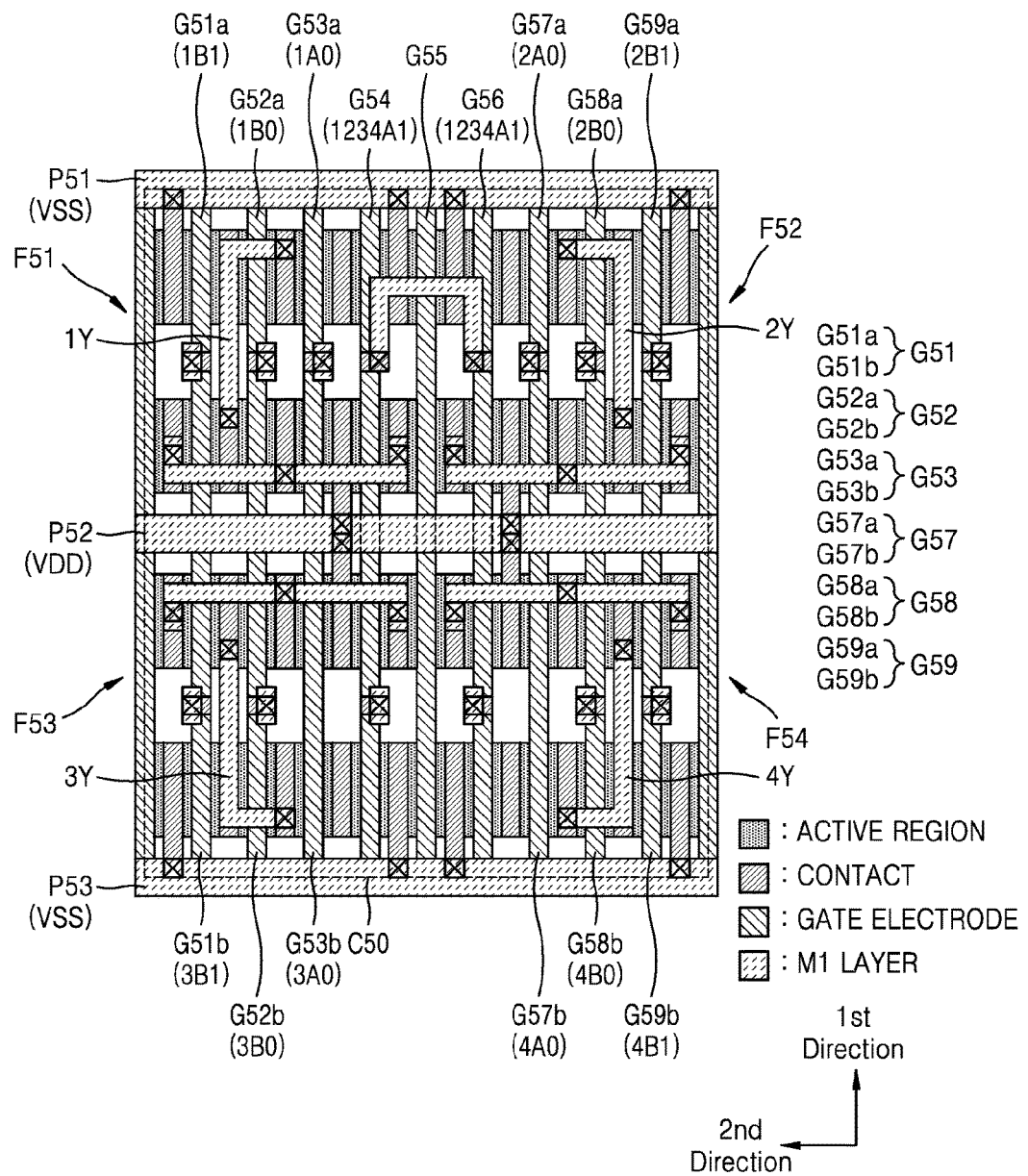

FIG. 5A is a block diagram and FIG. 5B is a layout plan diagram of a complex logic cell C50 according to an embodiment of the inventive concept.

Referring to FIG. 5A, the complex logic cell C50 includes first to fourth logic circuits F51 to F54 corresponding to four 2-2 AOI cells, respectively. The first to fourth logic circuits F51 to F54 may receive three specific input signals and one common input signal 1234A1, and may generate four output signals 1Y to 4Y, respectively. For example, the first logic circuit F51 may receive three input signals 1A0, 1B0, and 1B1 and one common input signal 1234A1, and may generate the first output signal 1Y. As illustrated in FIG. 5A, routing congestion for standard cells may be effectively alleviated by arranging the complex logic cell C50 instead of individually arranging four standard cells receiving a common input signal in an integrated circuit.

Referring to FIG. 5B, the complex logic cell C50 may include gate electrodes G51 to G59 extending in a first direction, and may further include voltage supply lines P51 to P53 extending in a second direction. As illustrated in FIG. 5B, the first and second logic circuits F51 and F52 may be arranged between the first and second voltage supply lines P51 and P52, and the third and fourth logic circuits F53 and F54 may be arranged between the second and third voltage supply lines P52 and P53. Furthermore, the first and second logic circuits F51 and F52 may be arranged by being separated by using the gate electrode G55 as a boundary, and the third and fourth logic circuits F53 and F54 may also be arranged in a manner such that they are separated by using the gate electrode G55 as a boundary. Hence, the gate electrode G55 may not be involved in an operation of the complex logic cell C50.

The first and third logic circuits F51 and F53 may share the gate electrode G54 to which the common input signal 1234A1 is applied. For example, the first and third logic circuits F51 and F53 may respectively include transistors formed from the gate electrode G54. In similar, the second and fourth logic circuits F52 and F54 may share the gate electrode G56 to which the common input signal 1234A1 is applied. For example, the second and fourth logic circuits F52 and F54 may respectively include transistors formed from the gate electrode G56. For convenience of description, FIG. 5B illustrates the gate electrodes G54 and G56 continuously extending in the first direction despite the second voltage supply line P52 disposed over the gate electrodes G54 and G56.

The gate electrodes G54 and G56 to which the common input signal 1234A1 is applied, may be electrically connected to each other by M1 layer patterns passing through the boundary (that is, the gate electrode G55) of the first and second logic circuits F51 and F52 in the complex logic cell C50. Therefore, the common input signal 1234A1 may be commonly input to the first to fourth logic circuits F51 to F54 included in the complex logic cell C50.

Referring to FIG. 5B, the unshared gate electrodes G51, G52, G53, G57, G58, and G59 may be cut at a boundary of the first and third logic circuits F51 and F53 and at a boundary of the second and fourth logic circuits F52 and F54 (e.g., near the second voltage supply line P52). Different input signals 1B1, 1B0, 1A0, 2A0, 2B0, 2B1, 3B1, 3B0, 3A0, 4A0, 4B0, and 4B1 may be applied to separated portions G51a, G52a, G53a, G57a, G58a, G59a, G51b, G52b, G53b, G57b, G58b, and G59b of the unshared gate electrodes G51, G52, G53, G57, G58, and G59, respectively.

As illustrated in FIG. 5B, the complex logic cell C50 may have 13 input pins and four output pins. For example, the complex logic cell C50, for the input signals, may include one M1 layer pattern connected to the gate electrodes G53 and G57, and twelve M1 layer patterns connected to the separated portions G51a, G52a, G53a, G57a, G58a, G59a, G51b, G52b, G53b, G57b, G58b, and G59b, respectively. Furthermore, the complex logic cell C50, for the output signals, may include four M1 layer patterns respectively outputting the first to fourth output signals 1Y to 4Y. As a result, compared to the four 2-2 AOI cells placed with total 20 pins, three pins to be otherwise connected to the M2 layer patterns may be omitted from the complex logic cell C50 of FIGS. 5A and 5B.

Figure 6A:
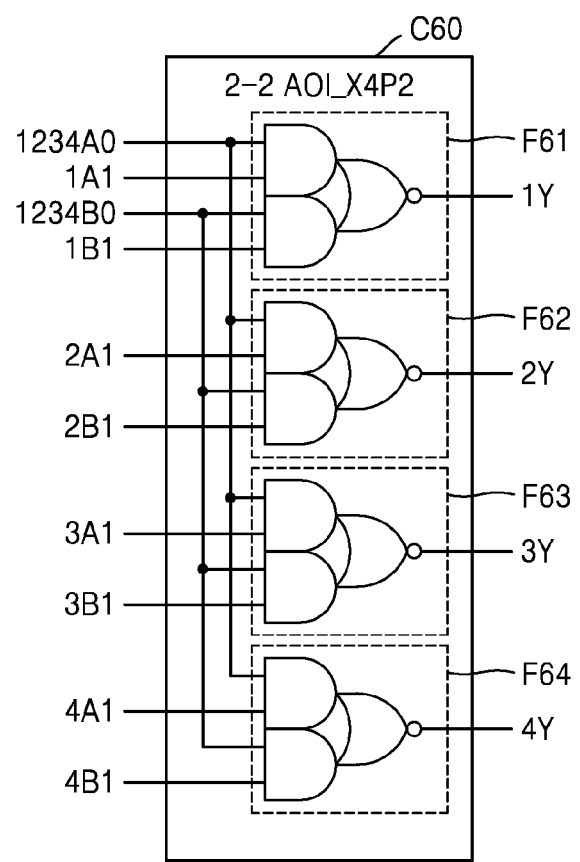
FIGS. 6A and 6B are a block diagram and a view of a layout of a complex logic cell, respectively, according to an embodiment of the inventive concept.
Figure 6B:
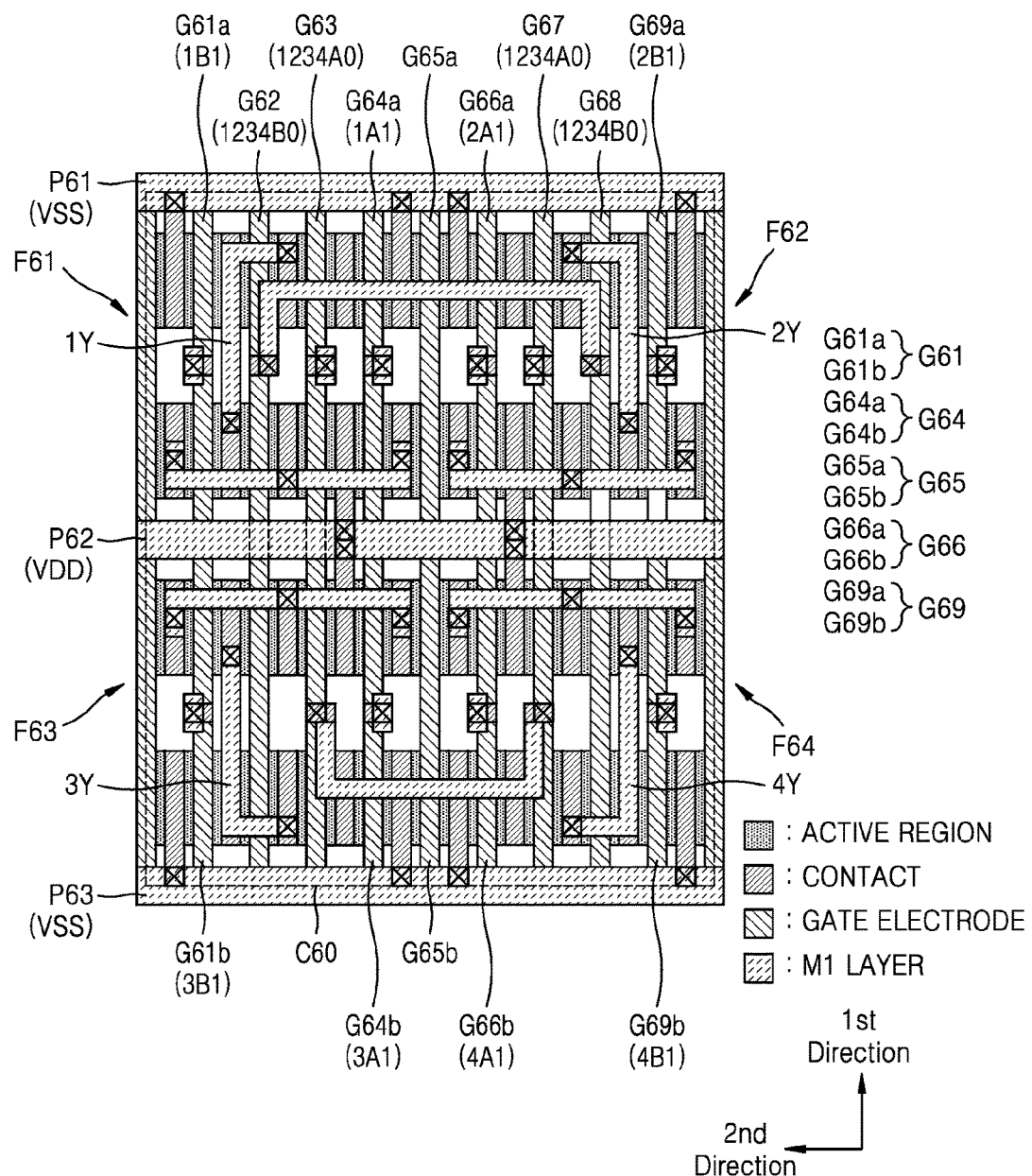

FIG. 6A is a block diagram and FIG. 6B is a layout plan view of a complex logic cell 60 according to an embodiment of the inventive concept. Here, the complex logic cell C60 includes four logic circuits sharing two common input signals.

Referring to FIG. 6A, the complex logic cell C60 includes first to fourth logic circuits F61 to F64 corresponding to four 2-2 AOI cells, respectively. The first to fourth logic circuits F61 to F64 may receive two specific input signals and two common input signals 1234A0 and 1234B0, and may generate four output signals 1Y to 4Y, respectively. For example, the first logic circuit F61 may receive two input signals 1A1 and 1B1 and the two common input signals 1234A0 and 1234B0, and may generate the first output signal 1Y. As illustrated in FIG. 6A, routing congestion for standard cells may be effectively alleviated by arranging the complex logic cell C60 instead of individually arranging four standard cells receiving common input signals in an integrated circuit.

Referring to FIG. 6B, the complex logic cell C60 may include gate electrodes G61 to G69 extending in a first direction, and may further include a plurality of voltage supply lines P61 to P63 extending in a second direction. As illustrated in FIG. 6B, the first and second logic circuits F61 and F62 may be arranged between the first and second voltage supply lines P61 and P62, and the third and fourth logic circuits F63 and F64 may be arranged between the second and third voltage supply lines P62 and P63. Furthermore, the first and second logic circuits F61 and F62 may be arranged by being separated by using the gate electrode G65 as a boundary, and the third and fourth logic circuits F63 and F64 may also be arranged by being separated by using the gate electrode G65 as a boundary. The gate electrode G65 may not be involved in an operation of the complex logic cell C60.

The first and third logic circuits F61 and F63 may share the gate electrode G62 to which the common input signal 1234B0 is applied and the gate electrode G63 to which the common input signal 1234A0 is applied. For example, the first and third logic circuits F61 and F63 may include transistors formed from the gate electrode G62, and may further include transistors formed from the gate electrode G63, respectively. In similar, the second and fourth logic circuits F62 and F64 may share the gate electrode G67 to which the common input signal 1234A0 is applied and the gate electrode G68 to which the common input signal 1234B0 is applied. For example, the second and fourth logic circuits F62 and F64 may include transistors formed from the gate electrode G67, and may further include transistors formed from the gate electrode G68, respectively. For convenience of description, FIG. 6B illustrates the gate electrodes G62, G63, G67, and G68 continuously extending in the first direction despite the second voltage supply line P62 disposed over the gate electrodes G62, G63, G67, and G68.

The gate electrodes G62 and G68 to which the common input signal 1234B0 is applied, may be electrically connected to each other by M1 layer patterns passing through the boundary (e.g., a separated portion G65a from the gate electrode G65) of the first and second logic circuits F61 and F62 in the complex logic cell C60. Furthermore, the gate electrodes G63 and G67 to which the common input signal 1234A0 is applied, may be electrically connected to each other by M1 layer patterns passing through the boundary (e.g., a separated portion G65b from the gate electrode G65) of the third and fourth logic circuits F63 and F64. Therefore, the common input signals 1234A0 and 1234B0 may be commonly input to the first to fourth logic circuits F61 to F64 included in the complex logic cell C60.

Referring to FIG. 6B, the unshared gate electrodes G61, G64, G66, and G69 may be cut at a boundary of the first and third logic circuits F61 and F63 and at a boundary of the second and fourth logic circuits F62 and F64 (e.g., near the second voltage supply line P62). Different input signals 1B1, 1A1, 2A1, 2B1, 3B1, 3A1, 4A1, and 4B1 may be applied to separated portions G61a, G64a, G66a, G69a, G61b, G64b, G66b, and G69b of the unshared gate electrodes G61, G64, G66, and G69, respectively.

As illustrated in FIG. 6B, the complex logic cell C60 may have ten input pins and four output pins. For example, input signals for the complex logic cell C60 may include M1 layer patterns connected to the gate electrodes G62 and G68, M1 layer patterns connected to the gate electrodes G63 and G67, and eight M1 layer patterns connected to the separated portions G61a, G64a, G66a, G69a, G61b, G64b, G66b, and G69b, respectively. Furthermore, output signals for the complex logic cell C60 may include four M1 layer patterns respectively outputting the first to fourth output signals 1Y to 4Y. As a result, compared to the four 2-2 AOI cells placed with total twenty pins, six pins otherwise to be connected to M2 layer patterns may be omitted from the complex logic cell C60 of FIGS. 6A and 6B.

Complex logic cells corresponding to two or four standard cells are described above with reference to FIGS. 3 to 6B according to exemplary embodiments of the inventive concept, but it will be understood that complex logic cells corresponding to 3, 4 or more standard cells receiving common input signals according to exemplary embodiments of the inventive concept may also be possible.

Figure 7A:
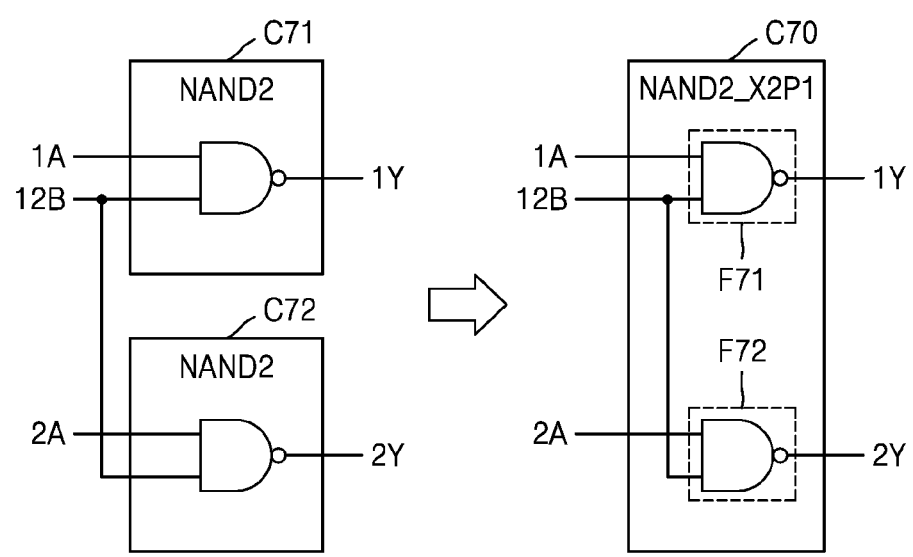

FIGS. 7A and 7B are respective, related views of standard cells sharing input signals and a complex logic cell C70 according to embodiments of the inventive concept. In more detail, FIG. 7A illustrates block diagrams of first and second NAND2 cells C71 and C72 and the complex logic cell C70, and FIG. 7B illustrates layout plan views for the first and second NAND2 cells C71 and C72 and the complex logic cell C70.

Referring the left block portion of the diagram of FIG. 7A, an integrated circuit may include the first and second NAND2 cells C71 and C72 sharing an input signal. For example, the first NAND2 cell C71 may receive an input signal 1A and a common input signal 12B, and may generate the first output signal 1Y. Furthermore, the second NAND2 cell C72 may receive an input signal 2A and the common input signal 12B, and may generate the second output signal 2Y.

Referring to the right block portion of the diagram of FIG. 7A, the integrated circuit may include the complex logic cell C70 receiving the input signals 1A, 12B, and 2A and generating the first and second output signals 1Y and 2Y, and the complex logic cell C70 may exhibit the same function as those of the first and second NAND2 cells C71 and C72 having one common input signal illustrated in the left block diagram of FIG. 7A. As illustrated in FIG. 7A, the complex logic cell C70 may include first and second logic circuits F71 and F72, which exhibits the same function as those of the first and second NAND2 cells C71 and C72, respectively, and a pair of input pins from among input pins of the first and second logic circuits F71 and F72 may be connected to each other within the complex logic cell C70. For example, the first logic circuit F71, like the first NAND2 cell C71, may receive the input signal 1A and the common input signal 12B, and may generate the first output signal 1Y. Furthermore, the second logic circuit F72, like the second NAND2 cell C72, may receive the input signal 2A and the common input signal 12B, and may generate the second output signal 2Y.

Referring to the left portion of the layout of FIG. 7B, the first and second NAND2 cells C71 and C72, which are single-height standard cells having a length H1 in a first direction, may be arranged adjacent to each other in a second direction in the integrated circuit. The first and second NAND2 cells C71 and C72 may have the same layout, and may include two M1 layer patterns for two input signals and one M1 layer pattern for one output signal, respectively. Although not shown in the left portion of the layout of FIG. 7B, the integrated circuit may include M2 layer patterns may be formed by a P&R tool to electrically connect M1 layer patterns connected to a gate electrode G72 of the first NAND2 cell C71 and M1 layer patterns connected to a gate electrode G75 of the second NAND2 cell C72 for the common input signal 12B.

Referring to the right portion of the layout of FIG. 7B, the complex logic cell C70, which is a single-height standard cell having the length H1 in the first direction, may include gate electrodes G76 to G79 extending in the first direction, and may further include voltage supply lines P73 and P74 extending in the second direction.

According to an embodiment of the inventive concept, gate electrodes to which a common input signal is applied may be arranged adjacent to each other in a complex logic cell, and the gate electrodes arranged adjacent to each other within the complex logic cell may receive the common input signal by being electrically connected to an M1 layer pattern. For example, in the complex logic cell C70 illustrated in the right side of FIG. 7B, the gate electrodes G77 and G78 to which the common input signal 12B is applied, may be neighboring electrodes and may be electrically connected to an M1 layer pattern.

According to an embodiment of the inventive concept, transistors formed from gate electrodes to which a common input signal is applied, may share a source region in a complex logic cell. For example, in the complex logic cell C70 illustrated in the right side of FIG. 7B, PMOS transistors formed from the gate electrodes G77 and G79 on an active region adjacent to a first power line P73, may be electrically connected to the first power line P73 and may share a source region to which a power supply voltage VDD is applied. Furthermore, NMOS transistors formed from the gate electrodes G77 and G79 on an active region adjacent to a second power line P74, may be electrically connected to the second power line P74 and may share a source region to which a ground voltage VSS is applied. Therefore, as illustrated in FIG. 7B, the complex logic cell C70 may have a reduced number of input pins, and may occupy a smaller area compared to when the first and second NAND2 cells C71 and C72 are arranged adjacent to each other because a length of the complex logic cell C70 in the second direction is reduced.

Figure 8A:
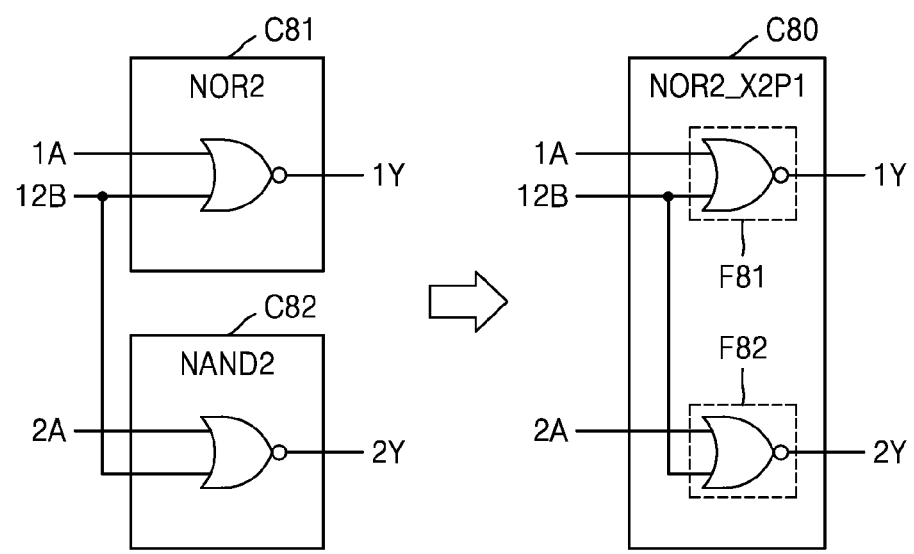
FIGS. 8A and 8B are views of standard cells sharing input signals and a complex logic cell, according to an embodiment of the inventive concept.
Figure 8B:
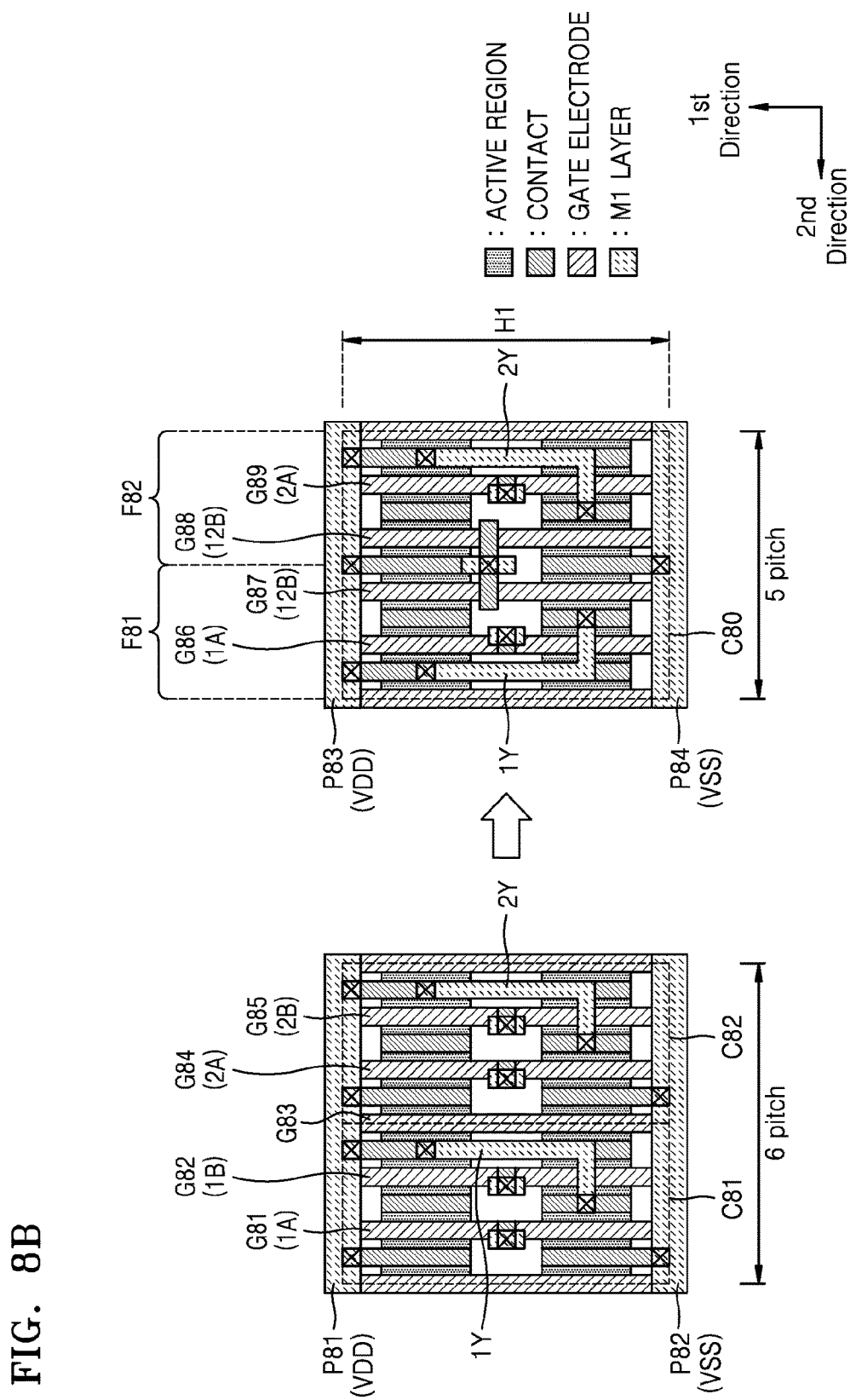

FIGS. 8A and 8B are views of standard cells sharing input signals and a complex logic cell C80 according to an embodiment of the inventive concept. In more detail, FIG. 8A includes block diagrams of first and second NOR2 cells C81 and C82 and the complex logic cell C80. FIG. 8B includes layout portions for the first and second NOR2 cells C81 and C82 and the complex logic cell C80.

Referring the left block diagram of FIG. 8A, an integrated circuit may include the first and second NOR2 cells C81 and C82 sharing an input signal. For example, the first NOR2 cell C81 may receive the input signal 1A and the common input signal 12B, and may generate the first output signal 1Y. Furthermore, the second NOR2 cell C82 may receive the input signal 2A and the common input signal 12B, and may generate the second output signal 2Y.

Referring to the right block diagram of FIG. 8A, the integrated circuit may include the complex logic cell C80 receiving the input signals 1A, 12B, and 2A and generating the first and second output signals 1Y and 2Y, and the complex logic cell C80 may exhibit the same function as those of the first and second NOR2 cells C81 and C82 having one common input signal illustrated in the left block diagram of FIG. 8A. As illustrated in FIG. 8A, the complex logic cell C80 may include first and second logic circuits F81 and F82, which exhibits the same function as those of the first and second NOR2 cells C81 and C82, respectively, and a pair of input pins from among input pins of the first and second logic circuits F81 and F82 may be connected to each other within the complex logic cell C80. For example, the first logic circuit F81, like the first NOR2 cell C81, may receive the input signal 1A and the common input signal 12B, and may generate the first output signal 1Y. Furthermore, the second logic circuit F82, like the second NOR2 cell C82, may receive the input signal 2A and the common input signal 12B, and may generate the second output signal 2Y.

Referring to the left block diagram of FIG. 8B, the first and second NOR2 cells C81 and C82, which are single-height standard cells having the length H1 in a first direction, may be arranged adjacent to each other in a second direction in the integrated circuit. The first and second NOR2 cells C81 and C82 may have the same layout, and may include two M1 layer patterns for two input signals and one M1 layer pattern for one output signal, respectively. Although not shown in the left layout of FIG. 8B, the integrated circuit may include M2 layer patterns formed by a P&R tool to electrically connect M1 layer patterns connected to a gate electrode G82 of the first NOR2 cell C81 and M1 layer patterns connected to a gate electrode G85 of the second NOR2 cell C82 for the common input signal 12B.

Referring to the right layout of FIG. 8B, the complex logic cell C80, which is a single-height standard cell having the length H1 in the first direction, may include gate electrodes G86 to G89 extending in the first direction, and may further include voltage supply lines P83 and P84 extending in the second direction. Similar to the examples of FIGS. 7A and 7B, in the complex logic cell C80 illustrated in the right side of FIG. 8B, the gate electrodes G87 and G88 to which the common input signal 12B is applied, may be neighboring electrodes and may be electrically connected to an M1 layer pattern. Furthermore, in the complex logic cell C80, PMOS transistors formed from the gate electrodes G87 and G88 on an active region adjacent to a first power line P83, may be electrically connected to the first power line P83 and may share a source region to which a power supply voltage VDD is applied. Furthermore, NMOS transistors formed from the gate electrodes G87 and G88 on an active region adjacent to a second power line P84, may be electrically connected to the second power line P84 and may share a source region to which a ground voltage VSS is applied. Therefore, as illustrated in FIG. 8B, the complex logic cell C80 may have a reduced number of input pins, and may occupy a smaller area compared to when the first and second NOR2 cells C81 and C82 are arranged adjacent to each other because a length of the complex logic cell C80 in the second direction is reduced.

Figure 9:
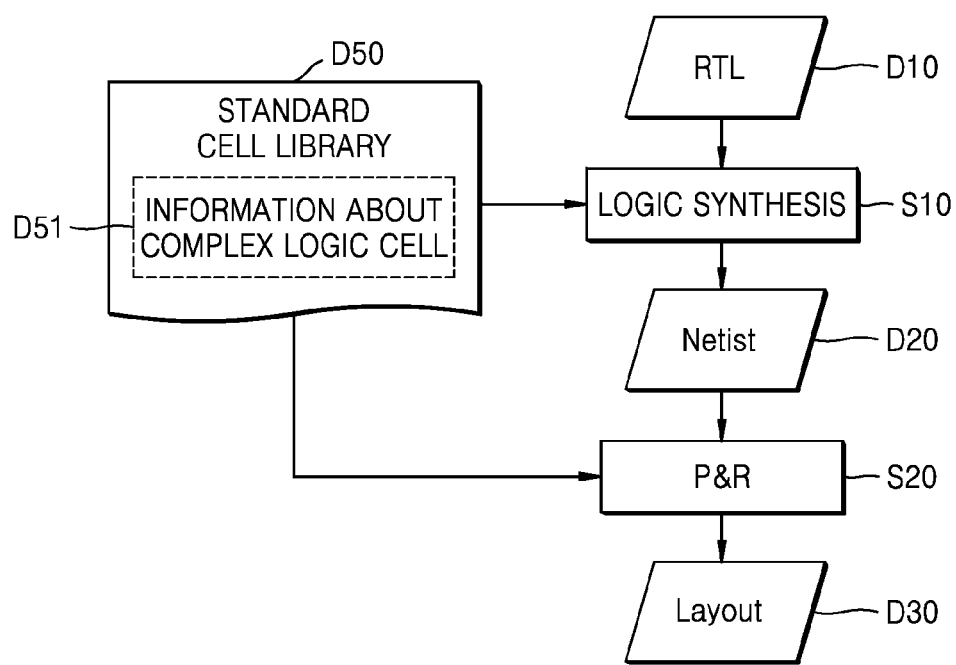
FIG. 9 is a flow chart illustrating a method of designing an integrated circuit including a complex logic cell, according to an embodiment of the inventive concept.

FIG. 9 is a flow chart illustrating a design method for an integrated circuit including a complex logic cell according to an embodiment of the inventive concept. As illustrated in FIG. 9, the complex logic cell may be referenced as a standard cell in a standard cell library D50, specifically including information D51 describing the complex logic cell. For example, the standard cell library D50 may include functional, structural, geometric, topographical and/or timing information describing the complex logic cell and its corresponding layout(s).

Referring to FIG. 9, in operation S10, a logic synthesis operation generating netlist data D20 from RTL data D10 may be performed. For example, a semiconductor design tool (e.g., a logic synthesis tool) may generate netlist data D20. The netlist data D20 may be generated as bitstream and/or netlist data from the RTL data D10 written in an HDL, such as VHDL or Verilog. The logic synthesis S10 may be performed with reference to the standard cell library D50. According to an embodiment of the inventive concept, the semiconductor design tool, when a plurality of standard cells having a common input signal are generated during the logic synthesis operation, may replace the standard cells with the complex logic cell with reference to the complex logic cell information D51 included in the standard cell library D50.

In operation S20, a place and routing operation generating layout data D30 from the netlist data D20 may be performed. For example, the semiconductor design tool (for example, a P&R tool) may generate the layout data D30 having a format like GDSII, from the netlist data D20, by placing and routing a plurality of standard cells with reference to the standard cell library D50. According to an embodiment of the inventive concept, the semiconductor design tool may place and route the complex logic cell as a standard cell, accordingly, the semiconductor design tool may perform routing under an increased degree of routing freedom. As a result, performance of an integrated circuit according to a layout generated by the semiconductor design tool may be improved.

Figure 10:
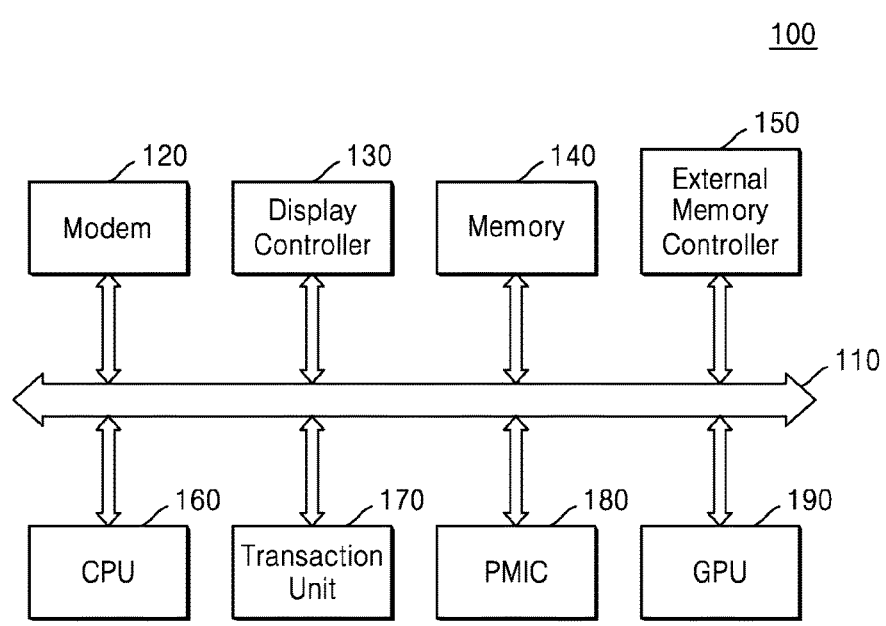
FIG. 10 is a block diagram of a system-on-chip (SoC) according to an embodiment of the inventive concept.

FIG. 10 is a block diagram of a system-on-chip (SoC) 100 according to an embodiment of the inventive concept. The SoC 100 may include an integrated circuit according to an embodiment of the inventive concept. The SoC 100 implements complicated function blocks (for example, intellectual property (IP)) performing various functions therein. A complex logic cell according to an embodiment of the inventive concept may be included in each of the function blocks of the SoC 100, and thus, performance of the SoC 100 may be improved.

Referring to FIG. 10, the SoC 100 may include a modem 120, a display controller 130, a memory 140, an external memory controller 150, a central processing unit (CPU) 160, a transaction unit 170, a power management integrated circuit (PMIC) 180, and a graphics processing unit (GPU) 190, and the function blocks of the SoC 100 may communicate with each other via a system bus 110.

The CPU 160 generally controlling operations of the SoC 100 may control operations of the other function blocks 120, 130, 140, 150, 170, 180, and 190. The modem 120 may demodulate a signal received from outside the SoC 100, or may modulate a signal generated in the SoC 100 and transmit the signal outside. The external memory controller 150 may control transmitting and receiving operations of data to/from an external memory device connected to the SoC 100. For example, a program and/or data stored in the external memory device may be provided to the CPU 160 or GPU 190 under the control of the external memory controller 150. The GPU 190 may execute program instructions related to graphics processing. The GPU 190 may receive graphic data through the external memory controller 150, and may also transmit the graphic data processed by the GPU 190 outside the SoC 100 through the external memory controller 150. The transaction unit 170 may monitor data transaction of each of the function blocks, and the PMIC 180 may control power supplied to each of the function blocks according to control of the transaction unit 170. The display controller 130 may control a display (or a display device) outside the SoC 100 and may transmit data generated in the SoC 100 to the display.

The memory 140 may include, as a nonvolatile memory, an electrically erasable programmable read-only memory (EEPROM), a flash memory, a phase change random access memory (PRAM), a resistive random access memory (RRAM), a nano-floating gate memory (NFGM), a polymer random access memory (PoRAM), a magnetic random access memory (MRAM), or a ferroelectric random access memory (FRAM), and may include, as a volatile memory, a dynamic random access memory (DRAM), a static RAM (SRAM), a mobile DRAM, a double data rate synchronous DRAM (DDR SDRAM), a low power DDR (LPDDR), a graphic DDR (GDDR) SDRAM, or a Rambus DRAM (RDRAM).

While the inventive concept has been particularly shown and described with reference to embodiments thereof, it will be understood that various changes in form and details may be made therein without departing from the scope of the following claims.

What is claimed is:

1. An integrated circuit comprising:
   a complex logic cell having a length in a first direction consistent with a multi-height standard cell for the integrated circuit, wherein the complex logic cell comprises a first logic circuit that provides a first output signal from a first input signal group and a common input signal group, and a second logic circuit that provides a second output signal from a second input signal group and the common input signal group,
   wherein the first and second logic circuits respectively comprise first and second transistors formed from first and second gate electrodes, the first and second gate electrodes extending in the first direction and receiving a common input signal of the common input signal group, and the first and second transistors share a source region, and
   wherein the first and second logic circuits share a power node and the common input signal group, and remaining portions of the first logic circuit are electrically insulated from remaining portions of the second logic circuit.

2. The integrated circuit of claim 1, wherein each of the first and second logic circuits is a NAND gate circuit or a NOR gate circuit.

3. The integrated circuit of claim 1, wherein the source region of the first and second transistors are electrically connected to a voltage supply line extending in a second direction perpendicular to the first direction.

4. The integrated circuit of claim 1, wherein the complex logic cell further comprises additional gate electrodes extending in the first direction and arranged at a constant interval, and first and second gate electrodes among the additional gate electrodes are neighboring electrodes and are electrically connected by patterns of a first metal wiring layer.

5. The integrated circuit of claim 1, wherein the first and second logic circuits are symmetrically arranged with respect to a line extending in the first direction between the first and second gate electrodes.

6. The integrated circuit of claim 1, wherein
   the first logic circuit further comprises a third transistor formed from the first gate electrode,
   the second logic circuit further comprises a fourth transistor formed from the second gate electrode, and
   the third and fourth transistors share the source region.

* * * * *